(12) United States Patent
Miyagawa et al.

(10) Patent No.: US 7,312,158 B2
(45) Date of Patent: Dec. 25, 2007

(54) METHOD OF FORMING PATTERN

(75) Inventors: Osamu Miyagawa, Yokkaichi (JP); Hideki Oguma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/373,335

(22) Filed: Mar. 13, 2006

(65) Prior Publication Data

US 2006/0216938 A1 Sep. 28, 2006

(30) Foreign Application Priority Data

Mar. 16, 2005 (JP) ............................. 2005-075143

(51) Int. Cl.
*H01I 21/202* (2006.01)
(52) U.S. Cl. ...................... 438/737; 438/706; 438/720; 438/736
(58) Field of Classification Search ................ 438/706, 438/710, 712, 720, 736, 737
See application file for complete search history.

(56) References Cited

U.S. PATENT DOCUMENTS

| 5,795,830 A | 8/1998 | Cronin et al. |
| 6,063,688 A | 5/2000 | Doyle et al. |
| 6,475,891 B2 | 11/2002 | Moon |
| 6,638,441 B2 | 10/2003 | Chang et al. |
| 6,716,761 B2 | 4/2004 | Mitsuiki |
| 2004/0043623 A1* | 3/2004 | Liu et al. .................... 438/736 |
| 2005/0016948 A1* | 1/2005 | Yang et al. .................... 216/13 |
| 2006/0234165 A1 | 10/2006 | Kamigaki et al. |

OTHER PUBLICATIONS

Mita, T. et al., "Object Detection Apparatus, Learning Apparatus, Object Detection System, Object Detection Method And Object Detection Program," U.S. Appl. No. 11/362,031, Filed Feb. 27, 2006.

* cited by examiner

*Primary Examiner*—Lan Vinh
(74) *Attorney, Agent, or Firm*—Finnegan, Henderson, Farabow, Garrett & Dunner, L.L.P.

(57) ABSTRACT

A method of forming a pattern, including forming first and second films, and a resist film on the second film, patterning the resist film to form a first pattern, etching the first pattern to narrow a width of the lines of the first pattern, etching the second film by using the first pattern as a mask to form a second pattern having a configuration of the first pattern transferred thereto, forming a third film above the substrate to cover the second pattern, filling a recessed portion of the third film corresponding to a gap between the lines of the second pattern with a fourth film, and removing a portion of the third film which is located on opposite sides of the fourth film, and a portion of the first film which is located below the third film to form a third pattern.

18 Claims, 6 Drawing Sheets

METHOD OF FORMING PATTERN

CROSS-REFERENCE TO RELATED APPLICATIONS

This application is based upon and claims the benefit of priority from prior Japanese Patent Application No. 2005-075143, filed Mar. 16, 2005, the entire contents of which are incorporated herein by reference.

BACKGROUND OF THE INVENTION

1. Field of the Invention

This invention relates to a method of forming a pattern and to a method of manufacturing a semiconductor device. In particular, this invention relates to the formation of a fine pattern to be employed in the manufacture of a semiconductor device.

2. Description of the Related Art

In the process of manufacturing a semiconductor device, the technique of photolithography is widely employed as a method of forming a pattern on a semiconductor substrate.

Since the technique of photolithography is limited with regard to the pattern resolution as the resolution is determined by the wavelength of light due to diffraction, it is difficult to form such a fine pattern that is more minute than the aforementioned resolution limit which is demanded in conformity with the enhancement in integration of semiconductor device.

In view of this, there has been proposed a method of forming such a fine pattern that exceeds the aforementioned resolution limit to be determined by the wavelength of light even in the employment of photolithographic technique (see for example, U.S. Pat. No. 6,063,688 and U.S. Pat. No. 6,638,441).

According to the method of forming a pattern which is disclosed in U.S. Pat. No. 6,063,688, a first pattern of silicon nitride film is formed on the surface of substrate by means of photolithography, and then a first sidewall film of silicon oxide film is formed on the sidewalls of the first pattern, the first pattern being subsequently removed to form a second pattern of silicon oxide film. Thereafter, a second sidewall film of silicon nitride film is formed on the sidewalls of the second pattern, and then the second pattern is removed to form a fine third pattern having a pitch one fourth that of the first pattern.

Further, according to the method of forming a pattern which is disclosed in U.S. Pat. No. 6,638,441, a first pattern of resist film is formed on the surface of substrate by means of photolithography, a first sidewall film of dielectric material is formed on the sidewalls of the first pattern, and then the space between a pair of the resultant first dielectric sidewall films facing each other is filled with a polymer. Thereafter, the first pattern is removed to form a second pattern having a structure where the space between neighboring dielectric sidewall films is filled with the polymer. Then, a second sidewall film of polymer is formed on the sidewalls of the second pattern, and the space between a pair of the resultant sidewall films facing each other is filled with a dielectric film. Subsequently, the polymer is removed to obtain a state where a line of dielectric film is added to the second pattern, thereby forming a fine second pattern having a pitch of one third that of the first pattern.

The methods of forming a pattern disclosed in U.S. Pat. No. 6,063,688 and U.S. Pat. No. 6,638,441 however are accompanied with a problem that the number of steps is inevitably increased since these methods include a plurality of etching steps where the etching of film is required to be performed deep enough to reach the surface of substrate.

Furthermore, when a film is etched to a sufficient extent to reach and expose the surface of substrate, the exposed surface of substrate is inevitably etched more or less. As a result, a step is caused to be created on the surface of substrate, the magnitude of this step becoming more prominent as the number of etching steps increases, thus resulting in the creation of asymmetric step portions on the opposite sides of the line of pattern, thus raising problems.

As a result, when it is desired to form a fine pattern on a substrate by making use of such a fine pattern as a mask, the working precision may be caused to deteriorate due to the existence of such steps, thus badly affecting the characteristics of semiconductor device.

For example, when a gate electrode is formed by etching a gate electrode material layer by means of the RIE method using the aforementioned fine pattern as a mask, the portion of the gate insulating film located at a deepest portion of the step is caused to expose before the other portion of the gate insulating film is permitted to expose due to the asymmetric steps created on the surface of the gate electrode material layer.

Since the gate insulating film is required to be as very thin as about 1 nm in compliance with a trend to further miniaturize semiconductor device in recent years, the gate insulating film that has been exposed at first due to over-etching may be destroyed.

BRIEF SUMMARY OF THE INVENTION

According to one aspect of the present invention, there is provided a method of forming a pattern, comprising: forming a first film and a second film successively on a main surface of a substrate; forming a resist film on the second film; patterning the resist film to form a first pattern having lines; subjecting the first pattern to an etching treatment to narrow a width of the lines of the first pattern; etching the second film by making use of the first pattern having the lines with narrowed width as a mask to form a second pattern having a configuration of the first pattern transferred thereto; forming a third film above the substrate to cover the second pattern; filling a recessed portion of the third film which corresponds to a gap between the lines of the second pattern with a fourth film; and removing, through etching, not only a portion of the third film which is located on opposite sides of the fourth film but also a portion of the first film which is located below the third film to form a third pattern.

According to another aspect of the present invention, there is provided a method of manufacturing a semiconductor device, comprising: forming a gate insulating film and a gate electrode film successively on a main surface of a substrate; forming a first film and a second film successively on the gate electrode film; forming a resist film on the second film; patterning the resist film to form a first pattern having lines; subjecting the first pattern to an etching treatment to narrow a width of the lines of the first pattern; etching the second film by making use of the first pattern having the lines with narrowed width as a mask to form a second pattern having a configuration of the first pattern transferred thereto; forming a third film above the substrate to cover the second pattern; filling a recessed portion of the third film which corresponds to a gap between the lines of the second pattern with a fourth film; removing, through etching, not only a portion of the third film which is located on opposite sides of the fourth film but also a portion of the first film which is located below the third film to form a third pattern; and etching the gate electrode film by making use of the third pattern as a mask to form a gate electrode.

DETAILED DESCRIPTION OF THE INVENTION

One embodiment of the present invention will be explained with reference to drawings.

FIGS. 1 through 9 are cross-sectional views illustrating in stepwise a method of forming a pattern according to one embodiment of the present invention.

Figure 1:
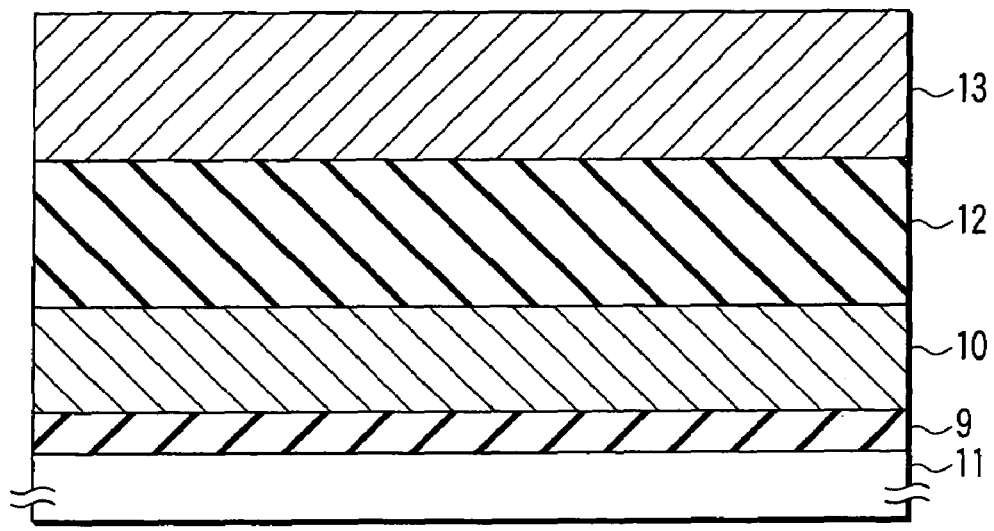
FIG. 1 is a cross-sectional view illustrating in stepwise a method of forming a pattern according to one embodiment of the present invention.

As shown in FIG. 1, a silicon substrate 11 having, for example, a gate insulating film 9 and a gate electrode film 10 formed thereon is prepared as a substrate. Then, as a first film, a tetraethyl orthosilicate (TEOS) film 12 having a thickness of about 200 nm is deposited on the gate electrode film 10 by means of chemical vapor deposition (CVD) method for example. Thereafter, as a second film, a polycrystalline silicon film 13 having a thickness of about 50 nm is deposited on the TEOS film 12 by means of CVD method for example.

Figure 2:
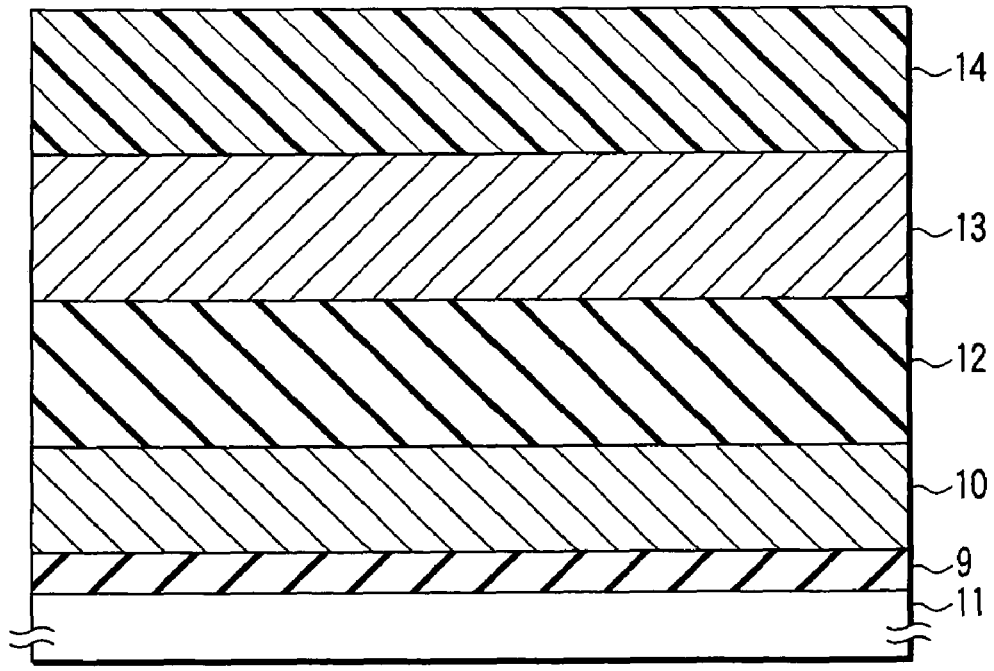
FIG. 2 is a cross-sectional view illustrating in stepwise a method of forming a pattern according to one embodiment of the present invention.

Then, as shown in FIG. 2, a resist film 14 is formed on the polycrystalline silicon film 13 to a thickness of about 300 nm for instance.

Figure 3:
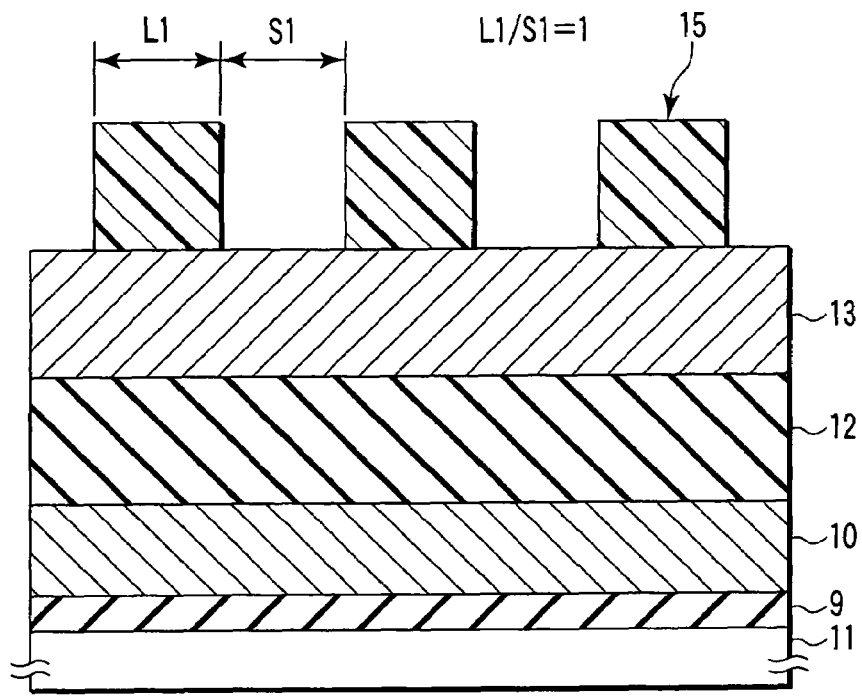
FIG. 3 is a cross-sectional view illustrating in stepwise a method of forming a pattern according to one embodiment of the present invention.

Next, as shown in FIG. 3, by means of photolithography, the resist film 14 is patterned to form a first pattern 15 having a line width L1 of about 60 nm which is close to a resolution limit to be determined by the wavelength of light to be employed in an exposure apparatus and a space width S1 which is substantially the same as that of the line width L1.

Figure 4:
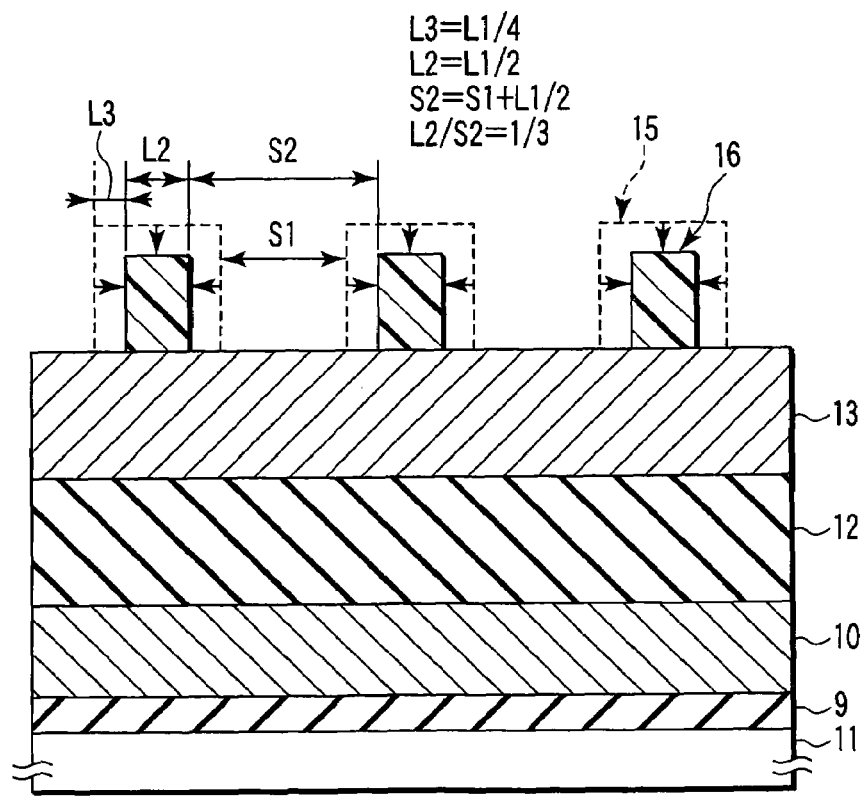
FIG. 4 is a cross-sectional view illustrating in stepwise a method of forming a pattern according to one embodiment of the present invention.

Thereafter, as shown in FIG. 4, the first pattern 15 is subjected to plasma etching using oxygen plasma for example, to narrow the line width, thereby converting the first pattern 15 into a first pattern 16 having a line width L2 and a space width S2.

More specifically, when the first pattern 15 is subjected to etching to such an extent as to make the slimming width L3, for example, about 15 nm, which is ¼ of L1, it is possible to obtain the first pattern 16 having a line width L2 of about 30 nm which is ½ of the line width L1 and a space width S2 having about 90 nm which is 3⁄2 of the space width S1.

Figure 5:
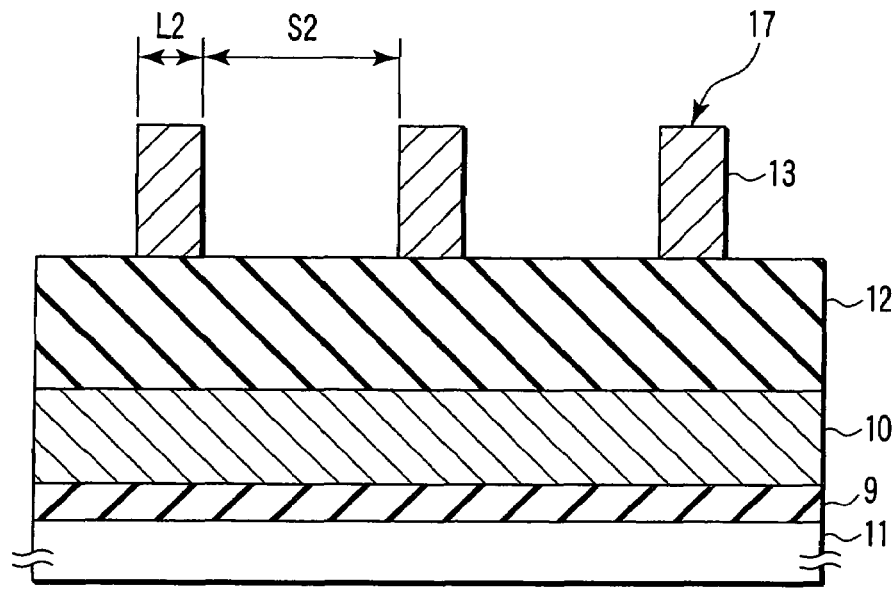
FIG. 5 is a cross-sectional view illustrating in stepwise a method of forming a pattern according to one embodiment of the present invention.

Then, by making use of the first pattern 16 as a mask, the polycrystalline silicon film 13 is etched by means of reactive ion etching (RIE) using a gas containing HBr for example, thereby forming a second pattern 17 wherein the configuration of the first pattern 16 has been transferred as shown in FIG. 5. Subsequently, the first pattern 16 is removed.

Figure 6:
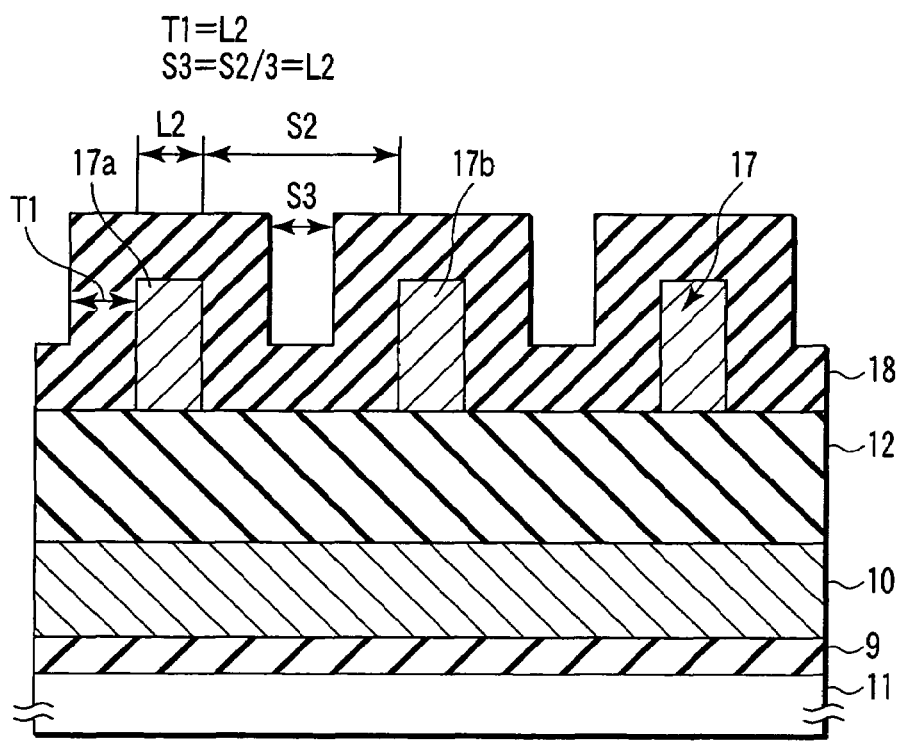
FIG. 6 is a cross-sectional view illustrating in stepwise a method of forming a pattern according to one embodiment of the present invention.

Then, as shown in FIG. 6, as a third film, a boron silicate glass (BSG) film 18 is formed so as to cover the second pattern 17 by means of CVD method for example. On this occasion, the BSG film is formed in such a manner that the film thickness T1 of the BSG film formed on the sidewall of the lines of the second pattern 17 becomes substantially the same as the line width L2 (30 nm) of the second pattern 17. As a result, the width S3 of the recessed portion of the boron silicate glass (BSG) film 18, which corresponds to the space between the lines 17a and 17b neighboring on the second pattern 17, is also made into 30 nm which is ⅓ of the space width S2 of the second pattern 17, thus rendering the space width S3 to become substantially equal to the line width L2.

Figure 7:
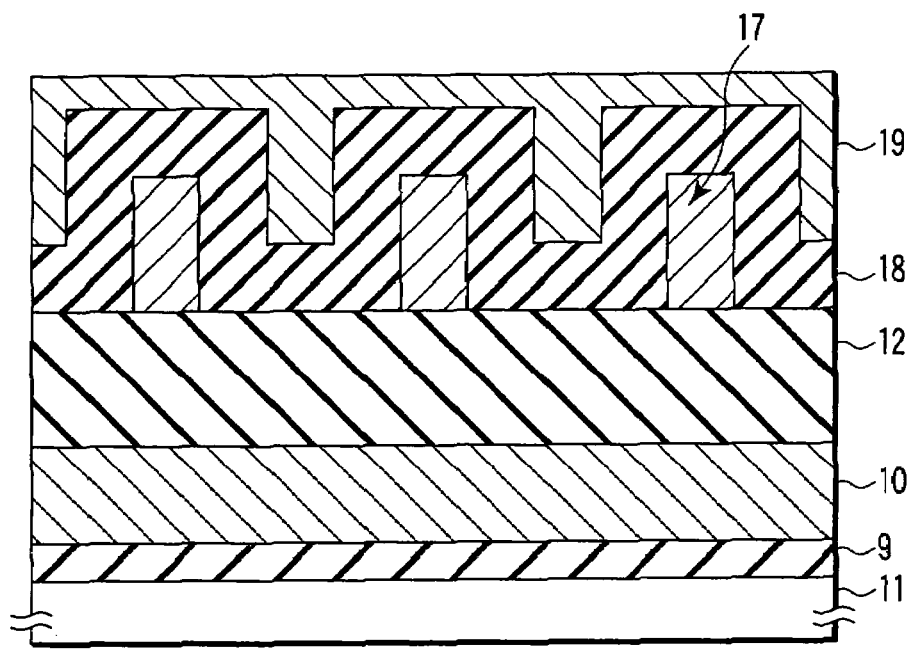
FIG. 7 is a cross-sectional view illustrating in stepwise a method of forming a pattern according to one embodiment of the present invention.
Figure 8:
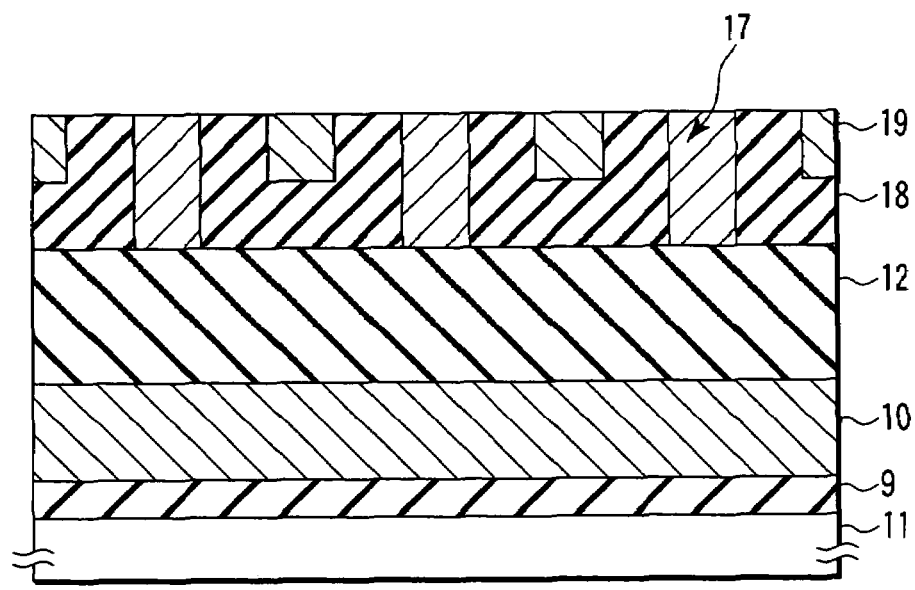
FIG. 8 is a cross-sectional view illustrating in stepwise a method of forming a pattern according to one embodiment of the present invention.
Figure 9:
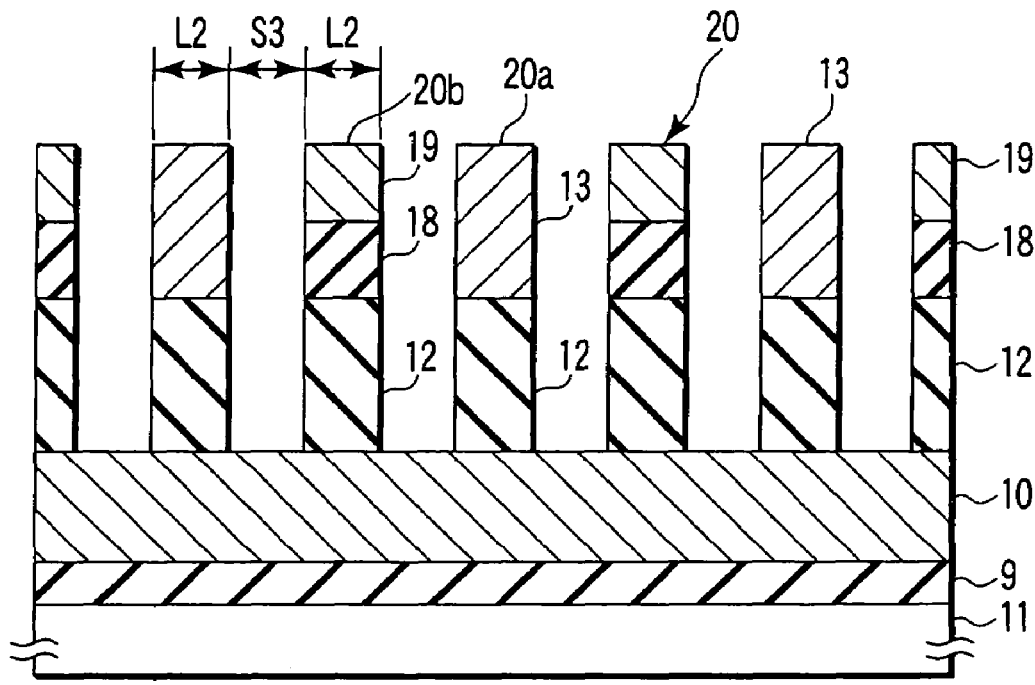
FIG. 9 is a cross-sectional view illustrating in stepwise a method of forming a pattern according to one embodiment of the present invention.

Thereafter, by means of the CVD method for example, as a fourth film, a polycrystalline silicon film 19 is formed on the boron silicate glass (BSG) film 18, thereby filling the recessed portion of the boron silicate glass (BSG) film 18, which corresponds to the space between the lines of the second pattern 17, with the polycrystalline silicon film 19, as shown in FIG. 7. Then, as shown in FIG. 8, by means of chemical mechanical polishing (CMP) method for example, the polycrystalline silicon film 19 and the BSG film 18 are polished until the top surface of the second pattern 17 is exposed, thereby removing an upper portion of the BSG film 18 as well as an upper portion of the polycrystalline silicon film 19. As a result, it is possible obtain a structure where the space between the lines of the second pattern 17 is filled with the polycrystalline silicon film 19.

Then, by making use of the second pattern 17 as a mask, RIE using $C_4F_8$ gas for example as an etchant is applied to the entire surface, thereby removing not only part of the BSG film 18 which is located on the opposite sides of the polycrystalline silicon film 19 that is filled in a space between the lines of the second pattern 17 but also the TEOS film 12 disposed below the BSG film 18 until the surface of the gate electrode film 10 is exposed.

As a result, it is possible to obtain a third pattern 20 comprising a first line 20a composed of a lamination of the TEOS film 12 and the polycrystalline silicon film 13 are successively deposited on the surface of the gate electrode film 10, and a second line 20b composed of a lamination of the TEOS film 12, the BSG film 18 and the polycrystalline silicon film 19 are successively deposited on the surface of the gate electrode film 10, the first line 20a and the second line 20b being disposed side by side with the line width L2 and a space width S3 which is approximately equal to the line width L2 and is secured between these lines 20a and 20b. Namely, the third pattern 20 has a pitch which is equivalent to ½ of the pitch of the first pattern 15, thus indicating possibilities of forming such a fine pattern that exceeds the resolution limit of photolithography.

Figure 10:
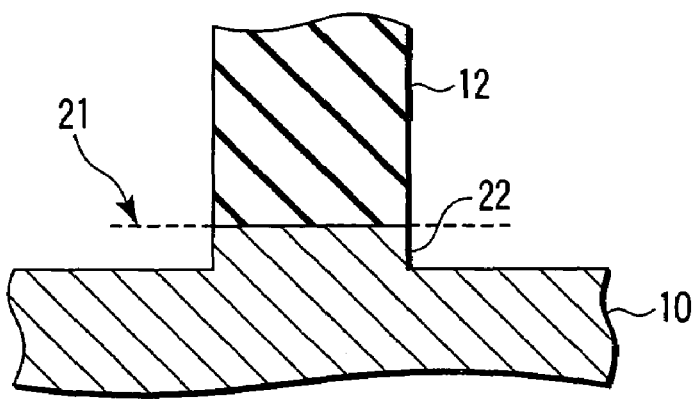
FIG. 10 is a cross-sectional view illustrating in stepwise a method of forming a pattern according to one embodiment of the present invention.

Herein, as shown in FIG. 10, although the surface 21 of the exposed gate electrode film 10 may be etched more or less to thereby create a step portion 22 on the occasion of etching the BSG film 18 and the TEOS film 12 existing below the BSG film 18 to such an extent to enable the surface 21 of the exposed gate electrode film 10 to expose, the size of the step portion 22 can be minimized since the process of etching these films to an extent to enable the surface 21 of the exposed gate electrode film 10 to expose is confined to only once in contrast to the conventional method where the process of etching these films to an extent to enable the surface of substrate to expose is required to be repeated a plurality of times. As a result, there are no possibilities that an asymmetrical step is caused to generate on the surface 21 of gate electrode film 10 after the process of forming the pattern.

Next, by making use of the third pattern 20 as a mask, the gate electrode film 10 on the silicon substrate 11 is etched to form a fine gate electrode, which is followed by the ordinary processes to manufacture a MOS transistor.

As explained above, according to this embodiment, since the first pattern 16 which has been made thinner in width through the etching of lines each having a fine width close to the resolution limit of photolithography is transferred to the second pattern 17 and fine lines each having the same width as that of the first pattern 16 are embedded between the lines of the second pattern 17, it is possible to form such a fine pattern having a pitch which is equivalent to ½ of the first pattern 15 and exceeds the resolution limit of photolithography.

As a result, it is possible to create a MOS transistor having a fine gate electrode. Therefore, due to this miniaturization, it is possible to manufacture a semiconductor device which is smaller in chip size and higher in integration.

In the foregoing description, the present invention has been explained based on one example of forming the third pattern 20 having a pitch which is equivalent to ½ of the first pattern 15. However, the present invention is not limited to such an example, so that the space width S1, the slimming width L3, the film thickness T1, etc., can be variously modified depending on the object desired to achieve.

Figure 11:
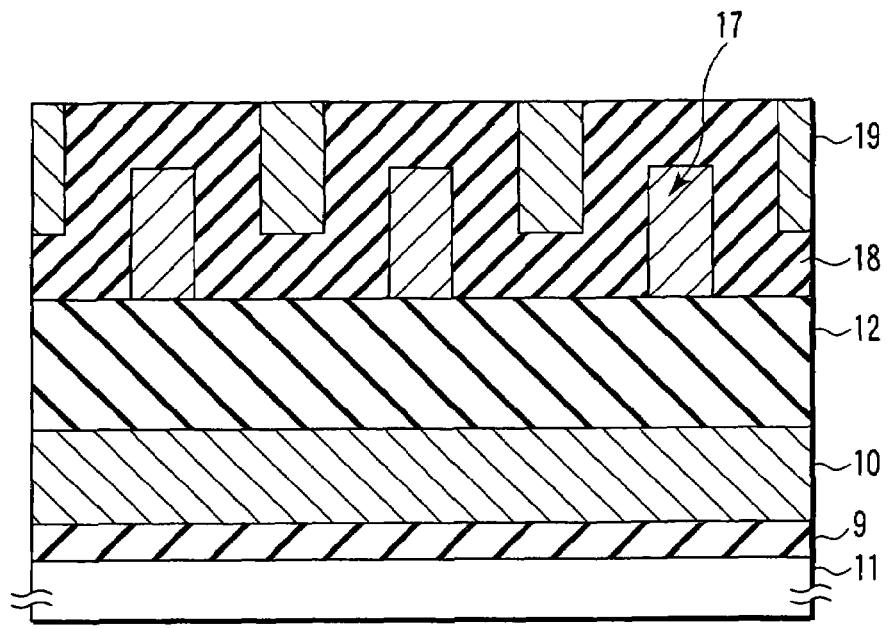
FIG. 11 is a cross-sectional view illustrating in stepwise a method of forming a pattern according to another embodiment of the present invention.

Further, in the foregoing description, the present invention has been explained based on one example where the surface of substrate 11 is polished until the second pattern 17 is exposed, thus removing upper portions of the BSG film 18 and the polycrystalline silicon film 19. However, the polishing may be performed in such a manner that only an upper portion of the polycrystalline silicon film 19 is removed and the top surface of the BSG film 18 is simply permitted to expose as shown in FIG. 11.

Figure 12:
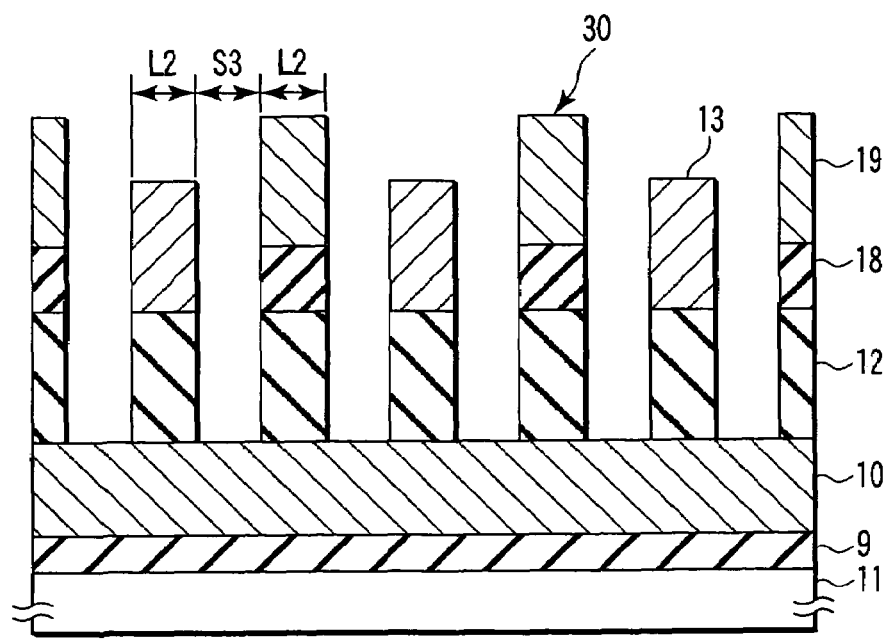
FIG. 12 is a cross-sectional view illustrating in stepwise a method of forming a pattern according to another embodiment of the present invention.

In this case, it is possible to obtain a third pattern 30 having step portions each equivalent to the film thickness T1 of the BSG film 18 as shown in FIG. 12, which is advantageous in that the time required for the CMP step can be shortened.

Further, in the foregoing description, the present invention has been explained based on one example where a TEOS film 12 is employed as the first film and a BSG film 18 is employed as the third film. However, as long as it is possible to obtain a higher etching rate than that of the polycrystalline silicon films 13 and 19 employed as the second and the fourth films, respectively, any kinds of film, such as phosphor silicate glass (PSG) film or silicon nitride film, can be employed as the first and the third films.

Namely, there is not any particular limitation with regard to the materials for the first film and the third film as long as they have a different etching selectivity from those of the second and the fourth films, so that the material for the first film and the third film may be the same with or different from each other and can be selected from a silicon oxide film and a silicon nitride film.

Further, as for the materials for the second film and the fourth film also, they may be the same with or different from each other and can be selected from various kinds of silicon films such as a polycrystalline silicon film and an amorphous silicon film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern, comprising:
   forming a first film and a second film successively on a main surface of a substrate;
   forming a resist film on the second film;
   patterning the resist film to form a first pattern having lines;
   subjecting the first pattern to an etching treatment to narrow a width of the lines of the first pattern;
   etching the second film by making use of the first pattern having the lines with narrowed width as a mask to form a second pattern having a configuration of the first pattern transferred thereto;
   forming a third film above the substrate to cover the second pattern;
   filling a recessed portion of the third film which corresponds to a gap between the lines of the second pattern with a fourth film; and
   removing, through etching, not only a portion of the third film which is located on opposite sides of the fourth film but also a portion of the first film which is located below the third film to form a third pattern,
   wherein the first film and the third film are both formed of silicon oxide or silicon nitride, and the second film and the fourth film are both formed of silicon.

2. The method according to claim 1, wherein the first film and the third film have a different etching selectivity from that of the second film and the fourth film.

3. The method according to claim 1, wherein the first film is formed of tetraethyl orthosilicate, the third film is formed of borosilicate glass, and the second film and the fourth film are both formed of polycrystalline silicon.

4. The method according to claim 1, wherein the third film has a thickness which is substantially equal to the line width of the second pattern.

5. The method according to claim 1, wherein the etching treatment of the first pattern is performed by means of plasma etching using oxygen plasma.

6. The method according to claim 1, wherein the filling of the recessed portion of the third film with the fourth film is performed by forming the fourth film on the third film, and then polishing the fourth film by means of chemical mechanical polishing.

7. The method according to claim 6, wherein the polishing is continued until the second pattern is exposed.

8. The method according to claim 6, wherein the polishing is continued until the third film is exposed.

9. A method of manufacturing a semiconductor device, comprising:

forming a gate insulating film and a gate electrode film successively on a main surface of a substrate;

forming a first film and a second film successively on the gate electrode film;

forming a resist film on the second film;

patterning the resist film to form a first pattern having lines;

subjecting the first pattern to an etching treatment to narrow a width of the lines of the first pattern;

etching the second film by making use of the first pattern having the lines with narrowed width as a mask to form a second pattern having a configuration of the first pattern transferred thereto;

forming a third film above the substrate to cover the second pattern;

filling a recessed portion of the third film which corresponds to a gap between the lines of the second pattern with a fourth film;

removing, through etching, not only a portion of the third film which is located on opposite sides of the fourth film but also a portion of the first film which is located below the third film to form a third pattern; and etching the gate electrode film by making use of the third pattern as a mask to form a gate electrode, wherein the first film and the third film are both formed of silicon oxide or silicon nitride, and the second film and the fourth film are both formed of silicon.

10. The method according to claim 9, wherein the first film and the third film have a different etching selectivity from that of the second film and the fourth film.

11. The method according to claim 9, wherein the first film is formed of tetraethyl orthosilicate, the third film is formed of borosilicate glass, and the second film and the fourth film are both formed of polycrystalline silicon.

12. The method according to claim 9, wherein the third film has a thickness which is substantially equal to the line width of the second pattern.

13. The method according to claim 9, wherein the line width of the first pattern after the etching treatment thereof is substantially equal to half of the line width of the first pattern before the etching treatment thereof.

14. The method according to claim 9, wherein the etching treatment of the first pattern is performed by means of plasma etching using oxygen plasma.

15. The method according to claim 9, wherein the filling of the recessed portion of the third film with the fourth film is performed by forming the fourth film on the third film and then polishing the fourth film by means of chemical mechanical polishing.

16. The method according to claim 15, wherein the polishing is continued until the second pattern is exposed.

17. The method according to claim 15, wherein the polishing is continued until the third film is exposed.

18. A method of forming a pattern, comprising:

forming a first film and a second film successively on a main surface of a substrat;

forming a resist film on the second film;

patterning the resist film to form a first pattern having lines;

subjecting the first pattern to an etching treatment to narrow a width of the lines of the first pattern;

etching the second film by making use of the first pattern having the lines with narrowed width as a mask to form a second pattern having a configuration of the first pattern transferred thereto;

forming a third film above the substrate to cover the second pattern;

filling a recessed portion of the third film which corresponds to a gap between the lines of the second pattern with a fourth film; and removing, through etching, not only a portion of the third film which is located on opposite sides of the fourth film but also a portion of the first film which is located below the third film to form a third pattern, wherein the line width of the first pattern after the etching treatment thereof is substantially equal to half of the line width of the first pattern before the etching treatment thereof.

* * * * *

UNITED STATES PATENT AND TRADEMARK OFFICE
CERTIFICATE OF CORRECTION

| | |
|---|---|
| PATENT NO. | : 7,312,158 B2 |
| APPLICATION NO. | : 11/373335 |
| DATED | : December 25, 2007 |
| INVENTOR(S) | : Miyagawa et al. |

It is certified that error appears in the above-identified patent and that said Letters Patent is hereby corrected as shown below:

Claim 18, column 8, line 18, change "substrat;" to --substrate;--.

Signed and Sealed this

Twenty-ninth Day of April, 2008

JON W. DUDAS
*Director of the United States Patent and Trademark Office*